United States Patent
Kanskar

(10) Patent No.: US 9,496,683 B1
(45) Date of Patent: Nov. 15, 2016

(54) WAVELENGTH LOCKING MULTI-MODE DIODE LASERS WITH CORE FBG

(71) Applicant: nLIGHT Photonics Corporation, Vancouver, WA (US)

(72) Inventor: Manoj Kanskar, Portland, OR (US)

(73) Assignee: nLIGHT, Inc., Vancouver, WA (US)

( * ) Notice: Subject to any disclaimer, the term of this patent is extended or adjusted under 35 U.S.C. 154(b) by 0 days.

(21) Appl. No.: 13/897,216

(22) Filed: May 17, 2013

(51) Int. Cl.
| | |
|---|---|
| H01S 5/06 | (2006.01) |
| H01S 5/065 | (2006.01) |
| H01S 3/063 | (2006.01) |
| H01S 3/13 | (2006.01) |
| H01S 3/137 | (2006.01) |
| H01S 3/139 | (2006.01) |

(52) U.S. Cl.
CPC ............ *H01S 5/0657* (2013.01); *H01S 3/063* (2013.01); *H01S 3/0635* (2013.01); *H01S 3/13* (2013.01); *H01S 3/137* (2013.01); *H01S 3/139* (2013.01)

(58) Field of Classification Search
CPC ........ H01S 3/063; H01S 3/0635; H01S 3/13; H01S 3/137; H01S 3/139; H01S 5/0657
USPC .................................................. 372/18, 29.02
See application file for complete search history.

(56) References Cited

U.S. PATENT DOCUMENTS

| | | | |
|---|---|---|---|
| 5,652,756 A * | 7/1997 | Stultz ...................... | H01S 3/067 372/10 |
| 5,761,234 A * | 6/1998 | Craig et al. ..................... | 372/75 |
| 6,343,088 B1 * | 1/2002 | Mugino .................. | H01S 5/028 372/49.01 |
| 7,068,900 B2 * | 6/2006 | Croteau ............. | G02B 6/03605 385/126 |
| 7,212,553 B2 | 5/2007 | Staroudoumov et al. | |
| 8,416,500 B2 * | 4/2013 | Mitra et al. ................... | 359/619 |
| 2003/0161379 A1 * | 8/2003 | Wolak et al. ................. | 372/108 |
| 2005/0175059 A1 * | 8/2005 | Leclair ............... | G02B 6/03622 372/102 |

\* cited by examiner

*Primary Examiner* — Armando Rodriguez
(74) *Attorney, Agent, or Firm* — Klarquist Sparkman, LLP

(57) ABSTRACT

A diode laser apparatus includes an optical fiber having a multi-mode inner cladding and a core, the core having a fiber Bragg grating disposed therein, a plurality of diode lasers configured to emit light, and optics configured to receive the light and to couple the light into the optical fiber, wherein a portion of the light coupled into the optical fiber is reflected by the fiber Bragg grating and is coupled back through the optics into the diode lasers so as to lock the wavelength thereof.

21 Claims, 1 Drawing Sheet

WAVELENGTH LOCKING MULTI-MODE DIODE LASERS WITH CORE FBG

BACKGROUND OF THE INVENTION

1. Field of the Invention

Generally, the field of the present invention is wavelength locking diode lasers. More particularly, the present invention relates to the wavelength locking diode lasers with fiber Bragg gratings.

2. Background

There are several on-chip wavelength locking methods for semiconductor lasers, such as built-in diffraction gratings providing distributed feedback or forming distributed Bragg gratings. Similarly, surface and volume grating have been used to wavelength-lock multiple semiconductor lasers in an external cavity configuration. Surface grating wavelength-locking techniques tend to be highly sensitive to environmental changes. For example, volume gratings have finite absorption in the glass due to impurities introduced for photo-sensitizing purposes which leads to self-heating. As a result, emission wavelength shifts due to glass heating. The amount of heating becomes more significant at larger powers, for example, over 200 W, impinges on the gratings, or as power settings change or fluctuate. As grating temperature increases, the associated Bragg resonance wavelength shifts, making it unwieldy in applications demanding tight center wavelength tolerance. Accordingly, a need remains for wavelength selective methods and devices without these and other attendant drawbacks.

SUMMARY OF THE INVENTION

According to one aspect of the present invention, a wavelength locking diode laser apparatus is provided which includes an optical fiber having a multi-mode inner cladding and a core, the core having a fiber Bragg grating disposed therein, a plurality of diode lasers configured to emit respective laser beams, and optics configured to receive the laser beams and to couple the laser beams into the optical fiber wherein a portion of the laser light coupled into the optical fiber is reflected by the fiber Bragg grating and is coupled back through the optics into the plurality of diode lasers so as to lock the wavelength of light emitted therefrom.

According to another aspect of the present invention, a wavelength locked semiconductor laser apparatus includes an optical fiber including a single mode core, a multi-mode inner cladding, and an outer cladding, the single mode core including a fiber Bragg grating written therein, a plurality of semiconductor diode lasers configured to emit respective semiconductor laser beam, collimation optics for collimating the semiconductor laser beams emitted by the plurality of semiconductor diode lasers, an objective lens configured to receive the collimated semiconductor laser beams and to direct the semiconductor laser beams into the multi-mode inner cladding of the optical fiber for propagation therein, wherein a portion of the light propagating through the multi-mode inner cladding is reflected by the fiber Bragg grating and propagates back through the single mode core, objective lens, and collimation optics, and into each diode laser of the plurality of diode lasers such that the wavelength of each diode laser is narrowed to a wavelength associated with a reflectivity characteristic of the fiber Bragg grating.

The foregoing and other objects, features, and advantages will become more apparent from the following detailed description, which proceeds with reference to the accompanying figures which may not be drawn to scale.

DETAILED DESCRIPTION OF THE INVENTION

Figure 1:
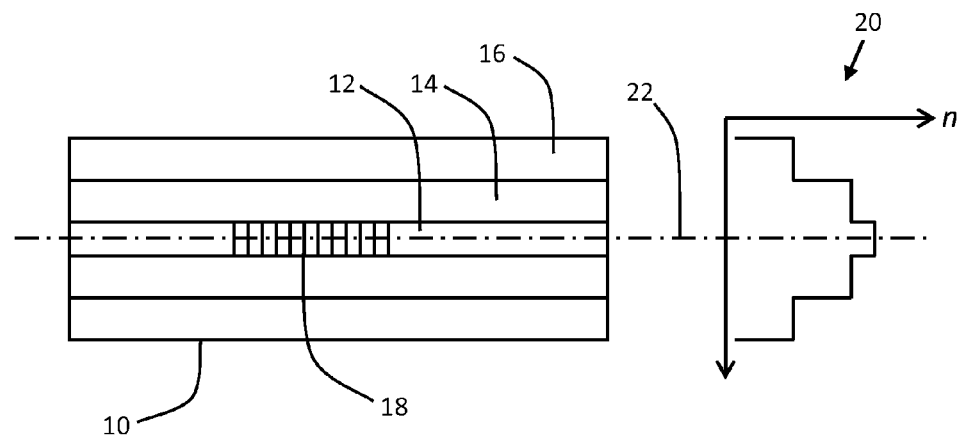
FIG. 1 is a side cross-sectional view of an optical fiber and associate refractive index profile in accordance with an aspect of the present invention.

Referring now to FIG. 1, an optical fiber 10 is shown in cross-section in accordance with an aspect of the present invention. The optical fiber 10 includes a core 12 longitudinally disposed in a middle of the optical fiber 10. The core 12 is surrounded by a first cladding 14. In typical embodiments, the optical fiber 10 is a double clad fiber that includes at least a second cladding 16 surrounding the first cladding 14. The second cladding 16 has a lower refractive index than the first cladding 14 allowing total internal refraction of light of relatively low brightness that is coupled into and propagating through the first cladding 14. The optical fiber 10 also includes a fiber Bragg grating 18 disposed in the core 12, but not in the surrounding first cladding 14 or second cladding 16. The fiber Bragg grating 18 has a reflectivity characteristic such that it is operable to selectively reflect light of a particular wavelength or wavelength ranges that is incident thereon. To the right of the optical fiber 10 in FIG. 1 is a sideways oriented plot of an example cross-sectional refractive index profile 20 of the optical fiber 10 along an axis transverse to a longitudinal axis 22 of the optical fiber 10. The example refractive index profile 20 is exaggerated to show the differences between the core 12 and claddings 14, 16.

Figure 2:
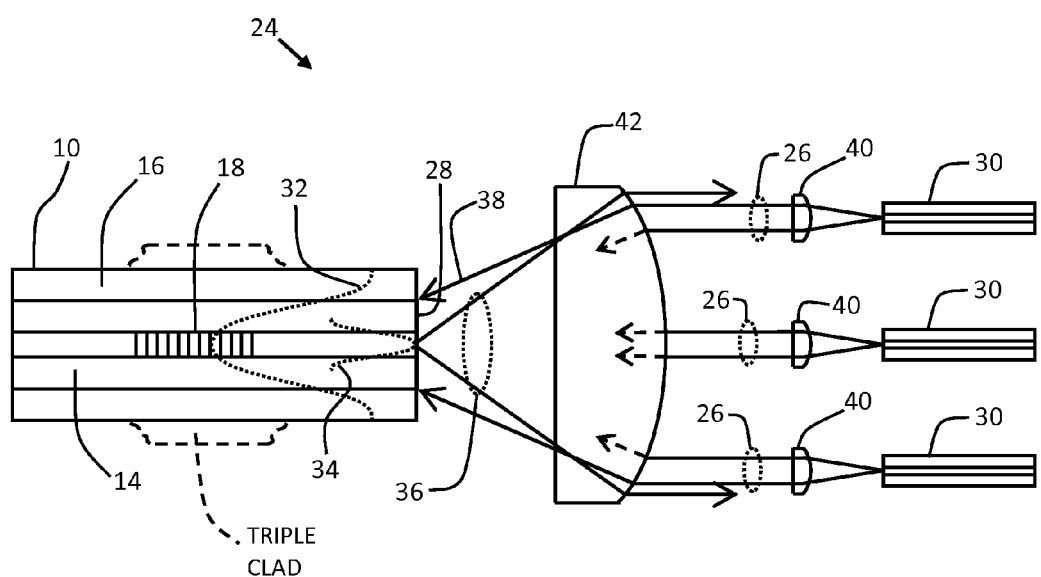
FIG. 2 is a schematic of a wavelength locked laser system in accordance with another aspect of the present invention.

Referring now to FIG. 2, a schematic of a wavelength selective apparatus 24 is shown in accordance with another aspect of the present invention. The wavelength selective apparatus 24 includes the optical fiber 10 of FIG. 1 situated to receive multimode semiconductor laser beams 26 optically coupled into a fiber input surface 28 of the optical fiber 10. The semiconductor laser beams 26 are produced by optical sources, such as single-emitter semiconductor diode lasers gain blocks 30. Guided by total internal reflection, the multimode light that has been coupled into the fiber 10, designated generally by left facing dashed line 32, propagates through the core 12 and first cladding 14 therein. In typical embodiments, the fiber Bragg grating 18 disposed in the core 12 has a narrow reflection band, such as greater than 0 nm but less than or equal to about 1 nm and is operable to reduce the bandwidth of the optical sources providing the semiconductor laser beams 26, which is typically 2 nm to 3 nm wide when running freely in a Fabry-Perot configuration without the aid of some wavelength narrowing mechanism.

In preferred examples, the core 12 is a single mode core or few-mode core (e.g., 5 or fewer transverse modes). Hereinafter, core 12 may be referred to as a single mode core though it will be appreciated that such term can encompass few-mode core variations. By locating the fiber Bragg grating 18 in the single mode core 12, a non-degenerate Bragg condition is ensured. That is, multimode laser light 32 that is guided in the multimode core 12 and first cladding 14 has numerous propagation constants and associated effective indexes for various guided optical modes. Each of the modes has an overlap with the central single mode core 12. Therefore, each of the modes excites a single mode with a single propagation constant inside the single mode core 12. Hence, the reflected wave, designated generally by right facing dashed line 34, from the fiber Bragg grating 18 satisfies the condition given by the equation:

$$\lambda_{vacuum}=2n_{eff}\Lambda_{grating}$$

where $\lambda_{vacuum}$ is the wavelength in vacuum, $n_{eff}$ is the effective index of the light inside the single mode core 12 and $\Lambda_{grating}$ is the pitch of the grating 18.

Since the cross-sectional area of the single mode core 12 of the optical fiber 10 is a small fraction of the multimode cross-sectional area associated with the first cladding 14, a corresponding small fraction is converted to single mode light. A fraction of the single mode light is reflected from the fiber Bragg grating 18 to become the reflected single mode light 34, depending on the reflectivity of the grating 18. In general, approximately a fraction denoted by ($\alpha \times R/A$) is the amount of light that becomes the reflected wave 34, where $\alpha$ is the cross-sectional area of the single mode core 12, R is the reflectivity of the fiber Bragg grating 18, and A is the cross-sectional area of the core 12 and cladding 14.

The reflected wave 34 has a narrow spectral band attributable to the characteristics of the fiber Bragg grating 18 and has a single spatial transverse mode due to the refractive index and diameter of the core 12. The reflected wave 34 is then emitted from the input surface 28 of the optical fiber 10 as a narrow band single mode beam 36. For clarity, single mode beam 36 is shown with marginal rays thereof having right facing arrows. A multimode light beam 38, which is coupled into the input surface 28 of the optical fiber 10, is shown with outer marginal rays thereof having left facing arrows at the input surface 28. The multimode light beam 38 typically includes a plurality of multimode light beams 26, emitted by the respective multimode semiconductor laser gain blocks 30, in single-emitter, bar, or other configuration. By coupling a portion or the entire reflected wave 34, which has a narrower spectral band, into the corresponding gain blocks 30, the wavelengths of light emitted by the gain blocks 30 can be locked. Herein wavelength locking refers to the narrowing of a spectral band of associated gain blocks in an unlocked configuration and also to selecting or adjusting the wavelength of the corresponding light emitted by associated gain blocks.

In many embodiments the multimode light beams 26 are collimated across one or more transverse propagation axes by collimation optics 40, such as cylindrical lens slow axis collimators or fast axis collimators. The multimode light beams 26 are coupled into the input surface 28 of the optical fiber 10 with a Fourier transform lens 42, such as an objective lens. Thus, the side view of the apparatus 24 in FIG. 2 can be understood as showing one orthogonal direction of the laser gain blocks 30 and corresponding the collimation optics as either slow or fast axis collimators, with distances between collimation optics 40 and gain blocks 30 and distances between collimation optics 40 and transform lens 42 being configured accordingly. The schematic looks similar in the other orthogonal direction except the aforementioned distances may be configured differently, such as providing collimation optics 40 with a different focal length.

The narrow band single mode beam 36 emitted from the input surface 28 is optically coupled to the lens 42 and is Fourier transformed to provide feedback to multiple multimode semiconductor laser gain blocks 30. For example, portions of the single mode beam 36 are received by the collimation optics 40 and coupled into anti-reflective coated input facets of the gain blocks 30. Other portions of the single mode beam 36 may miss the collimation optics 40 and not get coupled into the gain blocks 30. The back facets of the semiconductor laser gain blocks 30 are preferably highly reflectively coated. The input surface 28 is preferably anti-reflective coated. The diode laser beams 26 can be of arbitrary size depending on the telescopes used. Moreover, various diode configurations are possible, such as reflected, multiplexed, etc., and different coupling methods are appreciated to be within the scope of aspects of the present invention.

Accordingly, apparatuses in accordance with aspects of the present invention achieve wavelength locking of semiconductor laser gain blocks 30 by back-reflecting a portion of the light emitted therefrom with a fiber Bragg grating 18 disposed in a single mode core 12 of a section of optical fiber 10. A portion of the back-reflected light is coupled back into the gain blocks 30 and the wavelengths thereof are adjusted. Optical fibers in accordance with aspects of the present invention are configured with a single mode core and a first cladding 14 surrounding the single mode core 12. In some embodiments the core 12 may be offset or have different shapes. The core 12 has a fiber Bragg grating 18 disposed therein, which can be achieved through conventional methods of writing periodic shapes in the core 12. The fiber Bragg grating 18 is thus configured to reflect a portion of pump light propagating in the of optical fiber 10 so as to propagate reflected portion backwards through the single mode core 12 and back into associated gain blocks 30 for locking or narrowing the wavelength of light emitted therefrom.

Thus, in preferred examples, multimode light emitted by diode laser gain blocks 30 is collimated and incident on a Fourier transform lens 42. This light is coupled into a multimode optical fiber 10 to be used as pump light for various applications, such as solid state laser or fiber laser pumping. The guided modes of the pump light propagating in the optical fiber 10 have an overlap with the single mode core 12 of the optical fiber 10. Therefore, single mode pump light is generated inside the core 12 in the forward direction. The single mode pump light encounters the fiber Bragg grating 18 in the single mode core 12 and a portion thereof is reflected to become backwards propagating single mode pump light. The backwards propagating single mode pump light 34 is then emitted from the optical fiber 10 and is optically coupled via the Fourier transform lens 42 and collimation optics 40 back into the diode laser gain blocks 30. Since the spectral width of the backwards propagating light is narrow, e.g., less than 1 nm or narrower, as determined by the characteristics of the fiber Bragg grating 18, the diode gain blocks 30 become injection locked to the center wavelength of the fiber Bragg grating 18.

Thus, wavelength locking of gain blocks 30 can be achieved without the use of conventional externally or internally disposed elements, such as volume Bragg gratings or distributed feedback elements. Use of such elements can typically experience undesirable heating which can result in wavelength drift of the locked wavelength of the gain blocks 30 as a function of temperature or diode power. For example, in externally disposed VBG arrangements, as diode powers increase from just a few Watts to tens or several tens of Watts, the VBG element increases in temperature and the locked wavelength of the gain blocks 30 becomes longer and the linewidth broadens, typically in the range of picometers to hundreds of picometers. Thus, elimination of such elements that experience heating can also eliminate or mitigate the wavelength drift associated therewith.

It is thought that the present invention and many of the attendant advantages thereof will be understood from the foregoing description and it will be apparent that various changes may be made in the parts thereof without departing from the spirit and scope of the invention or sacrificing all of its material advantages, the forms hereinbefore described being merely exemplary embodiments thereof.

What is claimed is:

1. A wavelength locking diode laser apparatus, comprising:
   an optical fiber having a multi-mode inner cladding and a core, and a flat coupling surface perpendicular to the length of the optical fiber, said core having a fiber Bragg grating disposed therein and not in said cladding;
   a plurality of diode lasers configured to emit respective laser beams; and
   optics configured to receive the laser beams and to couple the laser beams into said optical fiber, said optics including collimation optics for collimating the laser beams into parallel collimated laser beams so as to provide a selectable propagation distance for the laser beams between the diode lasers and the fiber Bragg grating and including a lens situated to focus the parallel collimated laser beams at said flat coupling surface at a convergence angle defined by opposite convergent marginal rays so as to couple the laser beams into the cladding;
   wherein portions of the focused beams coupled into said optical fiber are reflected by said fiber Bragg grating and guided by said core so as to produce a reflected beam that is emitted from said flat coupling surface with a divergence angle defined by opposite divergent marginal rays that is greater than the convergence angle such that at least portions of the emitted beam are coupled back through said optics into said plurality of diode lasers sufficient to narrow the wavelength spectrum of light emitted therefrom while at least other portions of the emitted beam are coupled back through said optics and propagate so as not to be coupled into said plurality of diode lasers.

2. The apparatus of claim 1, wherein said optical fiber is a double-clad or triple-clad optical fiber.

3. The apparatus of claim 1 wherein said plurality of diode lasers are wavelength locked at a center wavelength of said fiber Bragg grating and with a full width half maximum of between about 0 nm and about 1 nm.

4. The apparatus of claim 1, wherein said portion of light that is reflected by said core fiber Bragg grating is between 0 percent and 10 percent of the light coupled into said optical fiber.

5. The apparatus of claim 1 wherein said plurality of diode lasers comprises a plurality of single-emitter diode lasers.

6. The apparatus of claim 5 wherein the power of said reflected beam coupled into said plurality of single-emitter diode lasers is not equally distributed among each of said diode lasers.

7. The apparatus of claim 1 wherein said plurality of diode lasers comprises a bar of diode lasers.

8. The apparatus of claim 1 wherein said optical fiber is a double-clad optical fiber.

9. The apparatus of claim 1 wherein said optical fiber is a triple-clad optical fiber.

10. The apparatus of claim 1, wherein said wavelength spectrum of the reflected beam is narrower than the wavelength spectrum of said plurality diode lasers.

11. The apparatus of claim 1 wherein said fiber Bragg grating has a reflectivity spectrum of between about 0 nm and about 1 nm full width half maximum.

12. The apparatus of claim 1 wherein each diode laser of said plurality of diode lasers includes an anti-reflectivity coated front facet and a high-reflectivity coated rear facet and the laser beam is emitted from said front facet.

13. The apparatus of claim 1 wherein the laser beam is coupled into an anti-reflectivity coated input surface of said optical fiber.

14. The apparatus of claim 1 wherein said plurality of diode lasers is wavelength locked to a center wavelength spectrum of the fiber Bragg grating and a full width half maximum of between about 0 nm and about 1 nm.

15. The apparatus of claim 1 wherein said optical fiber provides wavelength locking of said plurality of diode lasers without wavelength drift at incident powers.

16. The apparatus of claim 1 wherein said core is a single mode or few mode core.

17. A wavelength locked semiconductor laser apparatus, comprising:
   an optical fiber including a single mode core, a multi-mode inner cladding, an input end, and an outer cladding, said single mode core including a fiber Bragg grating written therein;
   a plurality of semiconductor diode lasers configured to emit respective semiconductor laser beams;
   collimation optics situated to collimate the semiconductor laser beams emitted by said plurality of semiconductor diode lasers and to provide a selectable propagation distance for the laser beams between the diode lasers and the fiber Bragg grating; and
   an objective lens configured to receive the collimated semiconductor laser beams and to focus the semiconductor laser beams into said multi-mode inner cladding of said optical fiber at a convergence angle defined by opposite convergent marginal rays for propagation therein;
   wherein a portion of the light coupled into said multi-mode inner cladding is reflected by said fiber Bragg grating to form a reflected beam that propagates back through said single mode core and out said input end of said optical fiber so as to diverge at an angle defined by opposite divergent marginal rays that is greater than the convergence angle so as to couple a reflected beam portion to said objective lens and collimation optics with at least a first portion of the reflected beam portion coupled to said plurality of diode lasers such that the wavelength of each diode laser is narrowed to a wavelength associated with a reflectivity characteristic of said fiber Bragg grating and with at least a second portion of the reflected beam portion missing the plurality of diode lasers.

18. The wavelength locked semiconductor laser apparatus of claim 17 wherein said optical fiber is a double-clad or triple-clad fiber.

19. The wavelength locked semiconductor laser apparatus of claim 17 wherein said plurality of semiconductor diode lasers is wavelength locked to a center wavelength spectrum of said fiber Bragg grating and with a full width half maximum of between about 0 nm and about 1 nm.

20. The apparatus of claim 1 wherein said core is a few mode core selected to provide additional beam power to laser beams marginally coupled to the lens in order to maintain wavelength locking of the light emitted from the marginally coupled diode lasers.

21. An apparatus, comprising:
- a plurality of diode lasers spaced apart from each other and situated to emit respective laser beams;
- a plurality of separate spaced apart cylindrical collimators each situated to receive a respective laser beam and to collimate the respective laser beam along a slow axis so as to form a plurality of parallel collimated laser beams that propagate along respective axes;
- an objective lens situated to receive the parallel collimated laser beams and to focus the parallel collimated laser beams at a convergence angle defined by opposite convergent marginal rays; and
- an optical fiber having a multi-mode inner cladding, a core, and a flat coupling surface perpendicular to the length of the optical fiber, the core having a fiber Bragg grating situated therein, the flat coupling surface situated to receive the focused laser beams from the objective lens so as to couple the focused laser beams into the multi-mode inner cladding so that a portion is reflected by the fiber Bragg grating to form a reflected beam that is guided by the core and emitted from the flat coupling surface at a divergence angle defined by opposite divergent marginal rays, wherein the divergence angle is greater than the convergence angle so that first portions of the emitted reflected beam are coupled by the objective lens and the plurality of separately spaced cylindrical collimators to the plurality of diode lasers so as to narrow the wavelength spectrum of light emitted from the plurality of diode lasers and second portions of the emitted reflected beam adjacent the opposite divergent marginal rays are incident to the objective lens and directed along axes that are outside of outermost propagation axes associated with the parallel collimated laser beams.

* * * * *